United States Patent [19]

Rhodes

[11] Patent Number: 4,902,379
[45] Date of Patent: Feb. 20, 1990

[54] UHV COMPATIBLE LIFT-OFF METHOD FOR PATTERNING NOBEL METAL SILICIDE

[75] Inventor: Howard E. Rhodes, Webster, N.Y.

[73] Assignee: Eastman Kodak Company, Rochester, N.Y.

[21] Appl. No.: 153,372

[22] Filed: Feb. 8, 1988

[51] Int. Cl.⁴ .................. B44C 1/22; C03C 15/00; C03C 25/06; C23F 1/02
[52] U.S. Cl. .................... 156/643; 156/646; 156/651; 156/653; 156/656; 156/657; 156/659.1; 204/192.37; 427/255.4; 437/201; 437/228
[58] Field of Search .............. 156/643, 646, 651, 653, 156/156, 657, 659.1, 662; 204/192.32, 192.35, 192.37; 437/196, 201, 228, 238, 241; 427/225.4

[56] References Cited

U.S. PATENT DOCUMENTS

| | | | |
|---|---|---|---|
| 4,109,372 | 8/1978 | Geffken | 29/571 |
| 4,180,596 | 12/1979 | Crowder et al. | 437/200 X |
| 4,398,341 | 8/1983 | Geipel et al. | 437/201 X |
| 4,528,744 | 7/1985 | Shibata | 29/571 |
| 4,640,738 | 2/1987 | Fredericks et al. | 437/200 X |

*Primary Examiner*—William A. Powell
*Attorney, Agent, or Firm*—Raymond L. Owens

[57] ABSTRACT

A method for making a pattern of a nobel metal silicide selectively forming the silicide under UHV conditions and then removes unreacted metal, by using a UHV-compatible lift-off process.

3 Claims, 1 Drawing Sheet

UHV COMPATIBLE LIFT-OFF METHOD FOR PATTERNING NOBEL METAL SILICIDE

FIELD OF THE INVENTION

This invention relates to forming a pattern of a nobel metal silicide on a silicon substrate.

BACKGROUND OF THE INVENTION

Nobel metal silicides and particularly iridium silicide can make excellent infrared sensitive Schottky barrier diodes which can be used in image sensors.

The solid phase of the iridium silicide should be formed free of contamination. The iridium silicide silicon interface is also critically important in obtaining high performance in these image sensors.

In U.S. Pat. No. 4,528,744 to Shibata, oxide regions are etched to reveal bare silicon substrate. Platinum metal is then deposited by an unspecified evaporation. The substrates are then annealed at 550° C. for 15 minutes under unspecified ambient conditions to form platinum silicide. Unreacted platinum metal is then removed with an aqua regia etch.

It should be noted there is no known etchant like aqua regia which attacks and dissolves platinum metal that attacks iridium metal. The teachings of Shibata will not work for selectively forming iridium silicide and removing unreacted iridium metal. This invention may form the metal silicide which are contaminated by oxygen.

U.S. Pat. No. 4,109,372 to Geffken, uses a photoresist lift-off technique to form selective regions of platinum silicide and remove the unreacted platinum. First, an undercut photoresist profile is obtained and the underlying oxide regions is etched to reveal the bare silicon substrate. Next, the metal is "deposited by evaporative techniques or any other suitable method." Deposited metals that are disclosed are palladium, platinum, rhodium, and nickel.

At this point it should be noted that this process will not work under UHV (Ultra High Vacuum) conditions since photoresist is an organic material that would outgas in a UHV system and degrade its vacuum performance. After the evaporation the photoresist is removed using a photoresist solvent. This resist removal step lifts off the unreacted platinum metal that was deposited onto the top of the photoresist. The substrate is then annealed at 200° C. to 550° C. to react the platinum metal with the silicon substrate to form platinum silicide.

SUMMARY OF THE INVENTION

The object of this invention is to provide a method of forming nobel metal silicide and particularly iridium silicides which are free from oxygen contamination, and provide excellent interface with the underlying silicon substrate.

It is a further objective of this invention to provide a means of removing unreacted iridium metal from oxide surfaces on the substrate without damaging the formed iridium silicide.

In particular, it has been found to obtain good control of the phase of the iridium silicide and the metal silicide/silicon interface, the iridium silicide can be (1) formed by the evaporation of a nobel metal under UHV conditions and (2) annealed at 250° C. to 800° C. under UHV to form iridium silicide. Evaporation is advantageous as other techniques such as sputtering may result in damage to the bare silicon substrate. This damage is caused by the high velocity of the impinging iridium and inert gas atoms in the sputtering process. Total UHV conditions during the evaporation and the subsequent anneal to form the metal silicide eliminates oxygen contamination that disrupts the silicide phase formation and provides an improved interface.

The above objects are achieved in a method of forming a pattern of a nobel metal silicide on a silicon substrate, comprising the steps of:

(a) forming a first UHV compatible inorganic layer of a first material on the silicon substrate;

(b) forming a second UHV compatible layer of a second material on the first layer;

(c) removing selective regions of the second inorganic layer and the underlying first layer exposing the surface of the silicon substrate;

(d) undercutting portions of the first layer so that the second layer overhangs the first layer;

(e) depositing a noble metal at a pressure of $10^{-8}$ Torr or less and heating the deposited material at a temperature of 250° C. to 800° C. to form metal silicide where the deposited metal contacts the exposed silicon; and (f) removing the second layer to lift-off the unreacted metal.

A feature of this invention is that oxygen free iridium silicide Schottky barrier diodes can be formed under UHV conditions notwithstanding the fact that there is no known etchant that will remove iridium metal.

The invention will be better understood from the following more detailed description taken with the accompanying drawings.

Figure 1:
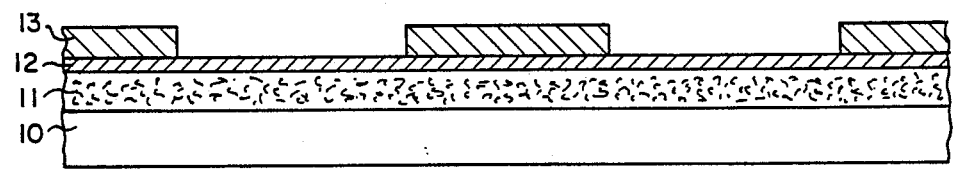
FIGS. 1 through 6 illustrate the basic sequence of steps in an illustrative process in accordance with the invention.

It should be appreciated that for purposes of exposition, the drawing is not to scale since the various dimensions particularly in the vertical direction of the drawing are quite small.

MODES OF CARRYING OUT THE INVENTION

With reference to FIGS. 1–6, in accordance with the invention, a UHV compatible lift-off process for the formation of nobel metal silicides on bare silicon regions is described.

A noble metal is a metal from the group consisting of iridium, platinum, palladium, osmium, rhodium, and rhenium.

An inorganic material forming layer 11 is deposited on the silicon substrate 10 which is doped p-type with boron. This invention also includes situations where the silicon substrate is doped n-type with phosphorus, arsenic, or antimony. The inorganic material forming layer 11 could be a grown or deposited silicon oxide, for example. A second inorganic material forming layer 12 is then deposited on top of layer 11. This inorganic material forming layer 12 could be a deposited silicon nitride layer. One requirement for materials chosen for layers 11 and 12 is that they be UHV compatible; that is, they must have low outgassing rates in a UHV system with a base pressure of less than $10^{-8}$ Torr and be able to maintain a low outgassing rate if they are heated to high temperatures in the UHV system. A low outgassing rate is defined here to mean that the vacuum in the UHV system never rises about $10^{-8}$ Torr during UHV processing. Photoresist 13 is then coated and patterned by processes that are well known in the semiconductor industry.

Figure 2:
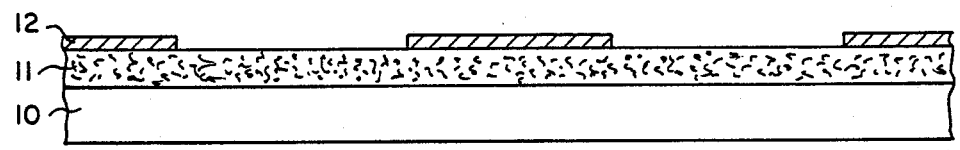

In FIG. 2 we show that the inorganic layer 12 has been etched using either a wet or plasma etch. In the case that layer 12 is silicon nitride a plasma etch using $SF_6$ could be used. The photoresist is then stripped using another plasma etch or a wet chemical stripping bath. The result is that selective regions of the layer 12 and the underlying oxide 11 have been removed exposing the surface of the silicon substrate 10.

Figure 3:
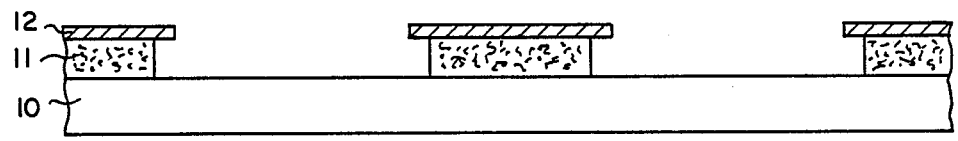

In FIG. 3 the substrate has been placed in an isotropic plasma etch or a wet etch that attacks layer 11 much faster than layer 12 giving rise to the undercut profile shown in FIG. 3 so that the layer 12 overhangs the layer 11. If layer 11 is silicon oxide, for example, the etchant could be an aqueous solution of hydrofluoric acid. Layer 11 is etched not only to give an undercut profile but also so that the bare silicon substrate is exposed.

Figure 4:
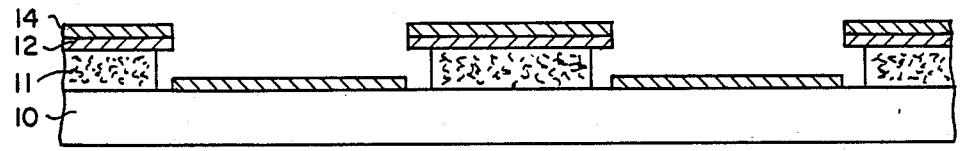

The substrates are then cleaned using well-known techniques. Prior to placing the substrates in the UHV system, the wafers are dipped in an HF-containing solution to remove any residual silicon oxide on the bare silicon regions. Metal 14, a noble metal such as iridium or platinum, is then evaporated in a UHV system with a base pressure of less than $10^{-8}$ Torr. This is shown in FIG. 4.

Figure 5:
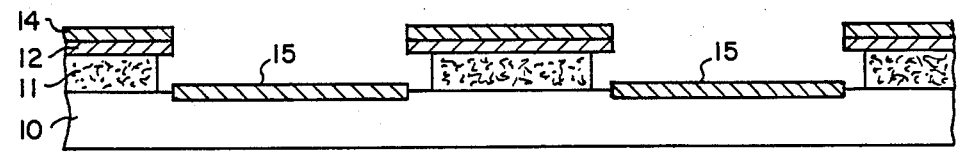

As shown in FIG. 5 the substrates are then annealed in the UHV system with a base pressure of less than $10^{-8}$ Torr at a temperature of 250° C. to 800° C. to form the metal silicide 15 where the metal is in intimate contact with the bare or exposed silicon substrate. Unreacted metal 14 remains over layer 12.

Figure 6:
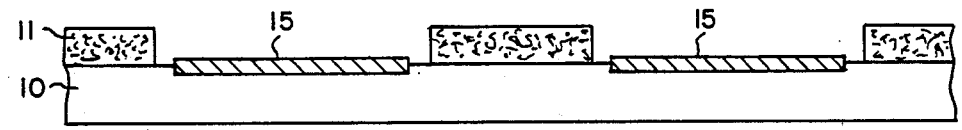

In FIG. 6 the substrates have been placed in an etchant solution or bath that attacks layer 12 but does not attack either layer 11 or the formed metal silicide 15. For example, when layer 11 is a silicon oxide, layer 12 is silicon nitride, and the metal 14 deposited is platinum or iridium which form platinum silicide or iridium silicide after annealing, a suitable etchant would be hot phosphoric acid. As layer 12 is attacked by the etchant, the unreacted metal 14 is lifted off the substrate and goes into the etchant solution.

The invention has been described in detail with particular reference to a preferred embodiment thereof, but it will be understood that variations and modifications can be effected within the spirit and scope of the invention.

I claim:

1. A method of forming a pattern of a noble metal silicide on a silicon substrate, comprising the steps of:
   (a) forming a first UHV (ultra High Vacuum)=compatible inorganic layer of a first material on the silicon substrate;
   (b) forming a second UHV (ultra High Vacuum)-=compatible layer of a second material on the first layer;
   (c) removing selective regions of the second inorganic layer and the underlying first layer exposing the surface of the silicon substrate;
   (d) undercutting portions of the first layer so that the second layer overhangs the first layer;
   (e) depositing a noble metal at a pressure of $10^{-8}$ Torr or less and heating the deposited material at a temperature of 250° C. to 800° C. to form metal silicide where the deposited metal contacts the exposed silicon; and
   (f) removing the second layer to lift-off the unreacted metal.

2. The method of claim 1 wherein the nobel metal is selected from the group consisting of: iridium, platinum, osmium, rhodium, and rhenium.

3. A method of forming a pattern of an iridium silicide on a silicon substrate, comprising the steps of:
   (a) forming a first UHV (ultra High Vacuum)=compatible inorganic oxide layer on the silicon substrate;
   (b) forming a second UHV (ultra High Vacuum)-=compatible nitride layer on the first layer;
   (c) removing by selective etching regions of the second inorganic layer and the underlying first layer exposing the surface of the silicon substrate;
   (d) etching to undercut portions of the first layer so that the second layer overhangs the first layer;
   (e) depositing iridium metal at a pressure of $10^{-8}$ Torr or less and heating the deposited material at a temperature of 250° C. to 800° C. to form iridium silicide where the deposited metal contacts the exposed silicon; and
   (f) removing the second layer by an etch to lift-off the unreacted iridium metal.

* * * * *